(12) United States Patent
Fasshauer

(10) Patent No.: US 9,000,955 B2
(45) Date of Patent: Apr. 7, 2015

(54) ARRANGEMENT FOR THE DETECTION OF BODY PARTS BY ABSORBING AN ELECTRICAL NEAR FIELD

(75) Inventor: Peter Fasshauer, Neubiberg (DE)

(73) Assignee: Ident Technology AG, Wessling (DE)

( * ) Notice: Subject to any disclaimer, the term of this patent is extended or adjusted under 35 U.S.C. 154(b) by 1273 days.

(21) Appl. No.: 12/516,360

(22) PCT Filed: Nov. 27, 2007

(86) PCT No.: PCT/EP2007/010293
§ 371 (c)(1),
(2), (4) Date: May 27, 2009

(87) PCT Pub. No.: WO2008/064864
PCT Pub. Date: Jun. 5, 2008

(65) Prior Publication Data
US 2010/0060489 A1    Mar. 11, 2010

(30) Foreign Application Priority Data

Nov. 27, 2006  (DE) .......................... 10 2006 056 240
Jan. 11, 2007  (DE) .......................... 10 2007 001 688

(51) Int. Cl.
*H03K 17/94*   (2006.01)
*H03M 11/00*   (2006.01)
(Continued)

(52) U.S. Cl.
CPC .. *H03K 17/955* (2013.01); *H03K 2217/960775* (2013.01); *E05F 15/0073* (2013.01); *E05F 2015/0086* (2013.01); *E05Y 2900/546* (2013.01)

(58) Field of Classification Search
CPC ..................................................... H03K 17/94
USPC ........................................................... 341/20
See application file for complete search history.

(56) References Cited

U.S. PATENT DOCUMENTS 4,016,490 A  *  4/1977  Weckenmann et al. ....... 324/671
5,166,679 A  *  11/1992  Vranish et al. ........... 340/870.37
(Continued)

FOREIGN PATENT DOCUMENTS

DE         4006119       8/1991
DE     10220725 A2       4/2003    .............. B60J 10/00
(Continued)

OTHER PUBLICATIONS

Japanese First Office Action, Japan Patent Application No. 2009-538632; with English translation, 15 pages, Sep. 25, 2012.
(Continued)

*Primary Examiner* — Hai Phan
*Assistant Examiner* — Amine Benlagsir
(74) *Attorney, Agent, or Firm* — King & Spalding L.L.P.

(57) ABSTRACT

The invention relates to an arrangement for detecting body parts by absorbing an electric near field. Various, particularly capacitive methods exist for detecting an approaching human body. Most of said methods operate on the principle that an electrode emits an alternating electric field, the distribution of which changes towards the environment when a body or body part approaches, and said change is detected by means of suitable electronics. The detection arrangement according to the invention is used for detecting objects, particularly moving limbs, that approach or are present in an observation zone and comprises a transmitter electrode device for inducing an alternating electric field in the observation zone or the surrounding area thereof, a receiver electrode device for detecting an electric field in the observation zone or said surrounding area, and an isolating electrode device for shielding part of the field that extends between the transmitter electrode and the receiver electrode.

21 Claims, 6 Drawing Sheets

Figure 1:
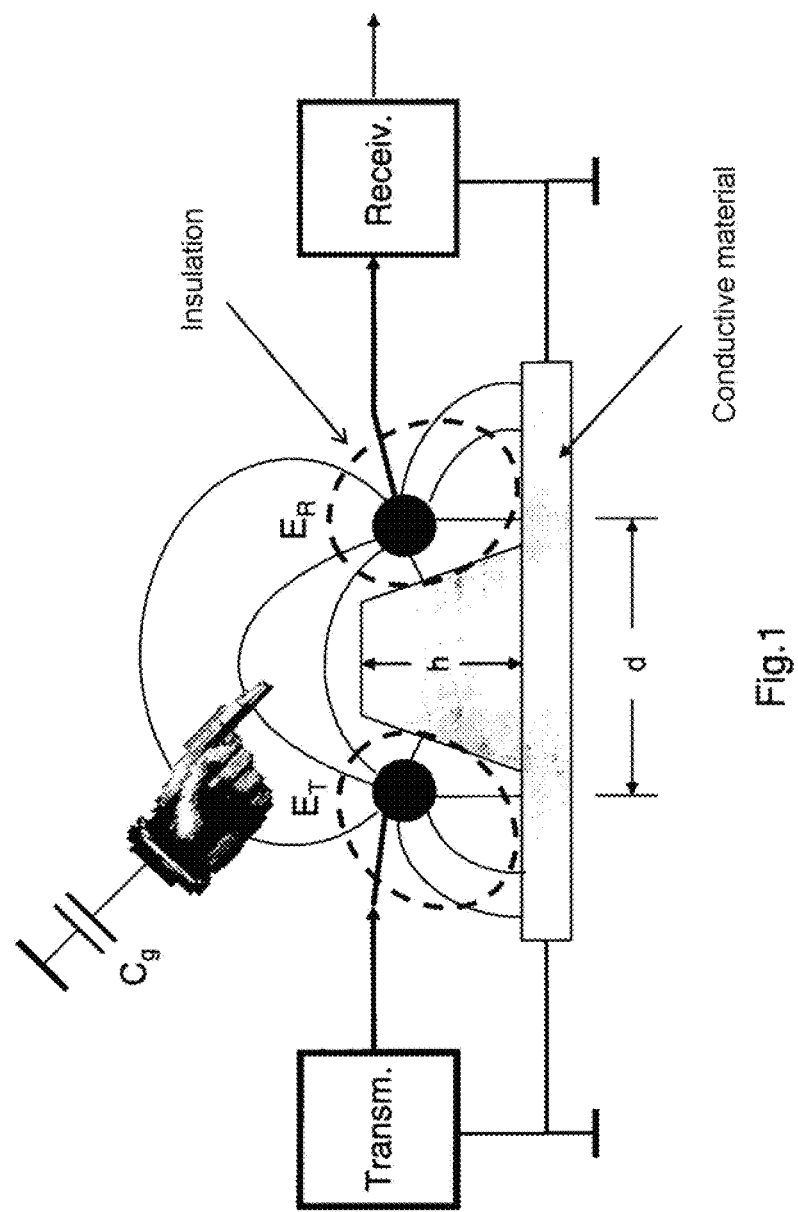

(51) Int. Cl.
*H03K 17/955* (2006.01)
*E05F 15/00* (2006.01)

(56) References Cited

U.S. PATENT DOCUMENTS

| | | | |
|---|---|---|---|
| 5,729,604 A * | 3/1998 | Van Schyndel | 379/388.01 |
| 5,973,318 A * | 10/1999 | Plesko | 250/227.22 |
| 6,348,862 B1 | 2/2002 | McDonnell | 340/562 |
| 6,445,294 B1 * | 9/2002 | McDonnell et al. | 340/562 |
| 6,700,393 B2 * | 3/2004 | Haag et al. | 324/674 |
| 6,724,324 B1 * | 4/2004 | Lambert | 341/33 |
| 6,859,141 B1 * | 2/2005 | Van Schyndel et al. | 340/562 |
| 7,015,666 B2 * | 3/2006 | Staus | 318/286 |
| 7,202,674 B2 * | 4/2007 | Nakano et al. | 324/661 |
| 7,545,153 B2 | 6/2009 | Abe | 324/663 |
| 2003/0090376 A1 * | 5/2003 | Thompson et al. | 340/541 |
| 2005/0069178 A1 * | 3/2005 | Nysaether et al. | 382/124 |
| 2006/0187038 A1 * | 8/2006 | Shieh et al. | 340/562 |
| 2008/0122456 A1 | 5/2008 | Moon et al. | 324/674 |

FOREIGN PATENT DOCUMENTS

| | | | | |
|---|---|---|---|---|
| JP | 52060158 | | 5/1977 | G01B 7/00 |
| JP | 58018102 | A | 2/1983 | G01B 7/00 |
| JP | 62180715 | A | 11/1987 | G01D 5/24 |
| JP | 620180715 | U | 11/1987 | G01D 5/24 |
| JP | 04123736 | A | 4/1992 | H01H 36/00 |
| JP | 2000048694 | A | 2/2000 | H01H 36/00 |
| JP | 2000505550 | A | 5/2000 | B60N 2/00 |
| JP | 3077751 | B | 8/2000 | B65D 33/38 |
| JP | 2000335363 | A | 12/2000 | B60R 21/16 |
| JP | 2001336908 | A | 12/2001 | A61B 6/10 |
| JP | 2002022404 | A | 1/2002 | B21C 51/00 |
| JP | 2002147117 | A | 5/2002 | E05F 15/20 |
| JP | 2002340700 | A | 11/2002 | G01B 7/00 |
| JP | 2003505675 | A | 2/2003 | B60N 2/00 |
| JP | 2005134129 | A | 5/2005 | G01B 7/00 |
| JP | 2005227244 | A | 8/2005 | B60J 5/00 |
| JP | 2005240428 | A | 9/2005 | B60J 5/00 |
| JP | 2006162374 | A | 6/2006 | G01B 7/00 |
| JP | 2007500345 | A | 1/2007 | G01B 7/00 |
| WO | WO-8908352 | | 9/1989 | |
| WO | 00/52657 | A | 9/2000 | B60N 2/00 |
| WO | 2004/059343 | A | 7/2004 | H03K 17/96 |

OTHER PUBLICATIONS

Korean Office Action, Application No. 1020097013559, 4 pages, Jun. 25, 2014.
International Search Report and Written Opinion, Application No. PCT/EP2007/010293, 14 pages, Oct. 27, 2008.
Japanese Office Action, Application No. 2009538632, 6 pages, Sep. 17, 2013.
Korean Office Action, Application No. 1020097013559, 10 pages, Dec. 21, 2013.

* cited by examiner

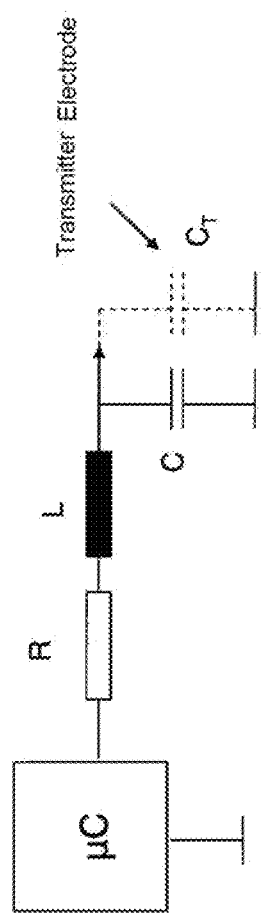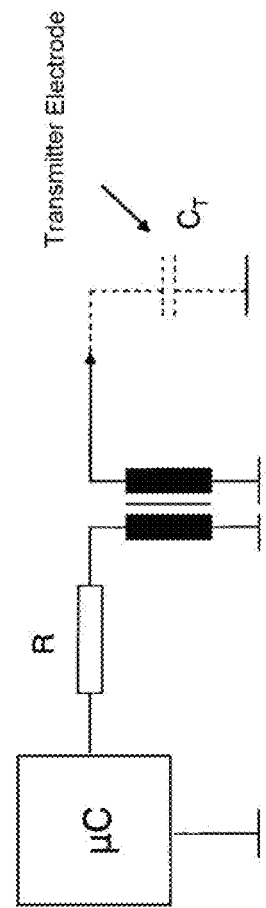
Fig. 4a
Fig. 4b

ARRANGEMENT FOR THE DETECTION OF BODY PARTS BY ABSORBING AN ELECTRICAL NEAR FIELD

CROSS REFERENCE TO RELATED APPLICATIONS

This application is the US national phase of PCT application PCT/EP2007/010293, filed 27 Nov. 2007, published 5 Jun. 2008 as WO2008/064864, and claiming the priority of German patent application 102006056240.2 itself filed 27 Nov. 2006 and German patent application 102007001688.5 itself filed 11 Jan. 2007, whose entire disclosures are herewith incorporated by reference.

For the detection of the approach of a human body to an object there are various, in particular capacitive, methods which usually operate on the principle that an electrode emits an electric alternating field which, on the approach of a body or body part, changes in terms of the field distribution in relation to the environment, and this change is detected by a suitable electronic system.

For a formal description of this effect, we can observe the capacity of this electrode which also changes on an approach due to the change in the field distribution. Particularly when such proximity sensors are used outdoors, there is a major problem in terms of the sensitivity to ambient moisture on the electrode, from rain or snow for example, which can lead to a dielectric change and thus a change in the capacity. This can have a serious impact on the detection reliability. Furthermore, such sensors are very sensitive to influences from metal parts in the proximity of the sensor electrode as these metal parts substantially alter the capacity of the sensor electrode, particularly when the metal parts are moved, such as is the case, for example, with car doors, sliding doors and sliding roofs. This has to be prevented by what are often quite complicated screening measures.

The task of the present invention is to develop a sensor arrangement which avoids these disadvantages and can be used without major complications on any object, preferably to secure against the risk of crushing in cars.

This task is solved in accordance with the invention by a detection arrangement to detect the approach or the presence of objects, in particular moving limbs, toward or in an observation zone with:
a transmitter electrode device to induce an electric alternating field in the observation zone or its surroundings,
a receiver electrode device to detect an electric field in the observation zone or its surroundings, and
an isolating electrode device for shielding part of the field that extends between the transmitter electrode and the receiver electrode.

Advantageous embodiments of the detection arrangement are the subject of the sub-claims.

The invention also relates to a detection arrangement for the detection of the presence of an object, in particular a living being in a space through which a moveable structure passes. In particular the invention relates here to a detection arrangement with which the presence of a person within the movement range of the hatchback door of a vehicle can be detected.

In accordance with the invention, the detection arrangement comprises a transmitter electrode to induce an electric alternating field in the observation zone or its surrounding area, and a receiver electrode device to detect an electric field in the observation zone or its surrounding area, whereby the generation of a signal regarding an approach status is based on the combined observation of two signals, whereby a first signal used here is a signal which correlates with the load on the transmitter system section, and the second signal is a signal which represents the strength of the field at the transmitter electrode device. This concept can also be used independently of the concept described above which includes isolating electrodes.

By using this technique to observe the movement path of a hatchback door of a car, the transmitter electrode device can be realized directly by the body of the hatchback door. This hatchback door is preferably connected to the vehicle body by an insulating structure. The electric consumers mounted in the area of the hatchback door are also connected to the vehicle electric system by their own earth connections. The transmitter electrode device can also take the form of a different structure, e.g. a u-shaped strip or wire electrode laid along the bottom and side edges of the hatchback door. The transmitter electrode device can also be integrated by other means in the hatchback door. In particular, it is also possible to realize the transmitter electrode device in the rear window, in particular in the integrated rear window heating system.

The receiver electrode device is preferably located in the area of the closing or sealing edges of the vehicle body.

The first signal can be, in particular, the current to the transmitter electrode device, in particular also the power intake of the transmitter electrode device, the phase angle between current and voltage or the characteristics of the time-related course of current and/or voltage within the range of the transmitter system.

The second signal is preferably a signal which correlates directly with the strength of the field advancing toward the receiver electrode device.

The detection arrangement can also be realized in reverse, i.e. components on the hatchback door side function as receiver electrodes and electrode structures on the body function as transmitters.

It is possible to establish certain reference information for the opening and closing operation of a hatchback door, in particular the course of reference signals, and to check whether any deviations from these reference processes occur during opening or closing.

Figure 2:
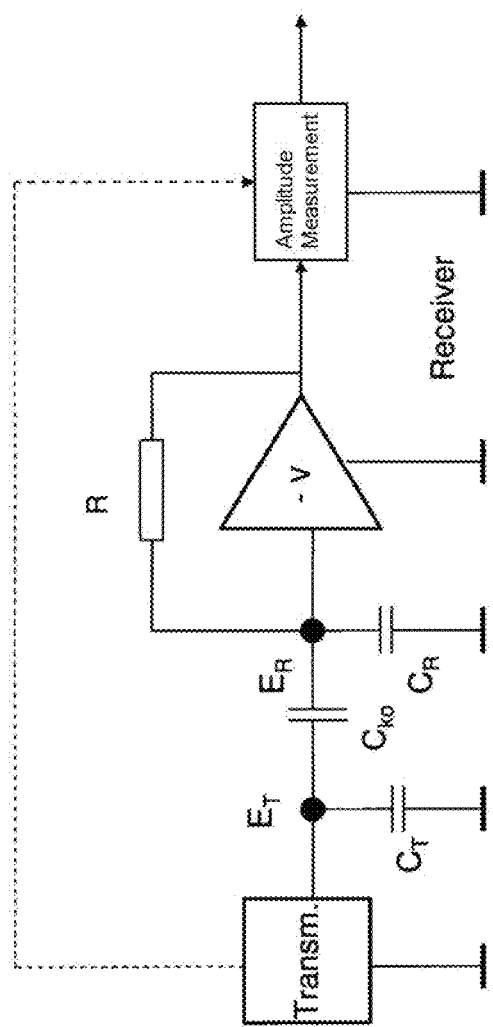
Figure 3:
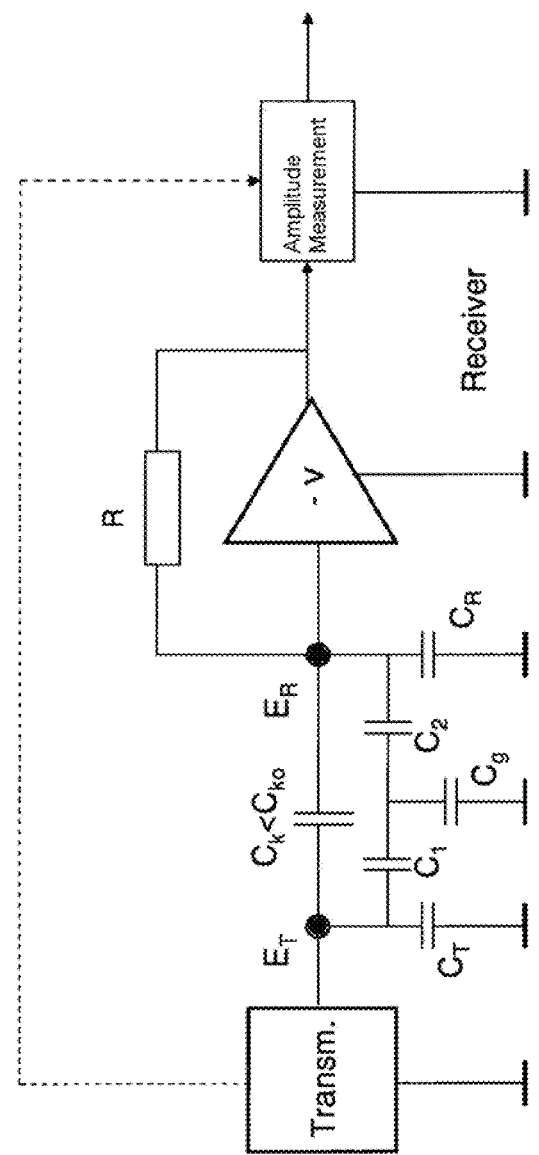
Figure 5:
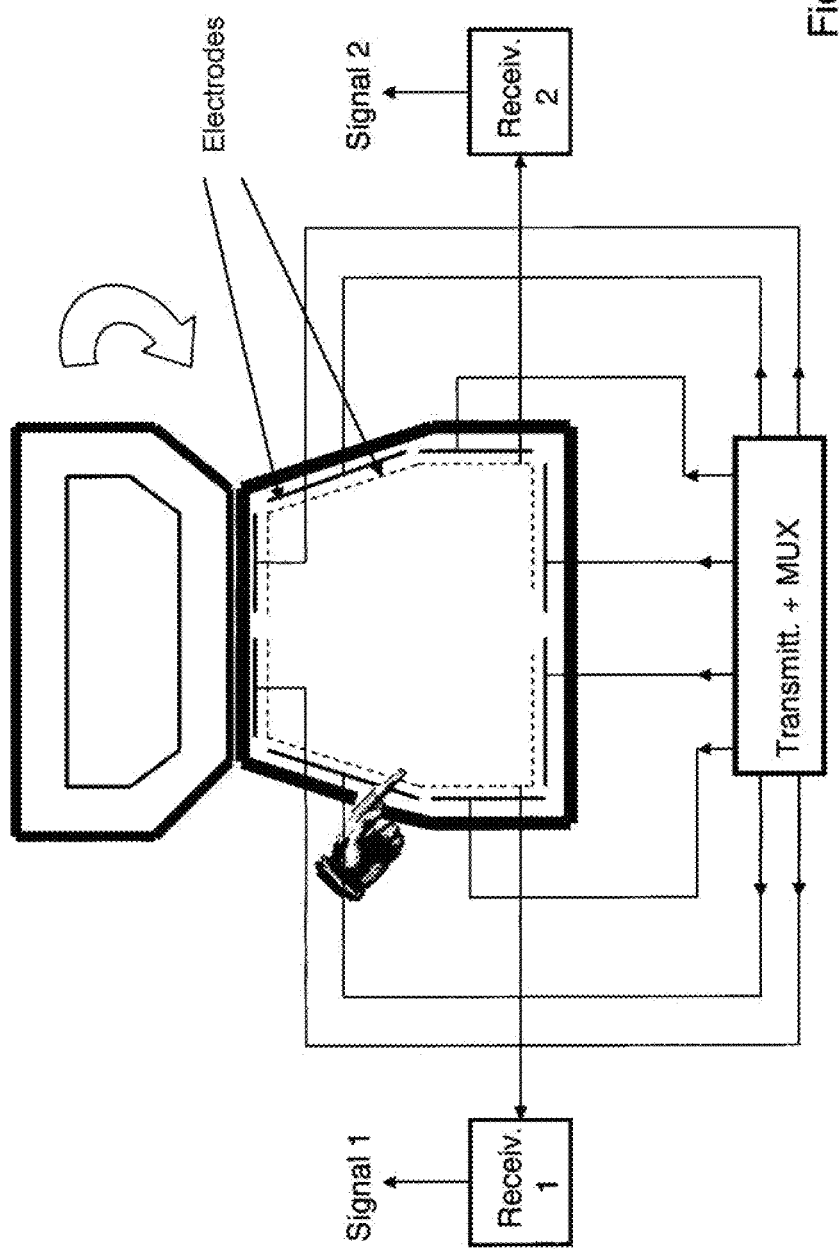
Figure 6:
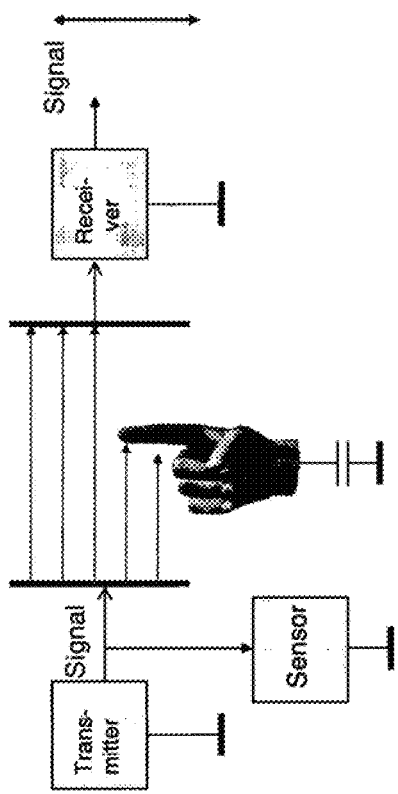

Further details and features of the inventions are set out in the following description in conjunction with the drawings. These are:

FIG. 1 a diagram to illustrate the basic concept of a sensor system in accordance with the invention in which the detection of approaches takes place on the basis of field absorption;

FIG. 2 an equivalent circuit of the sensor system in the basic position;

FIG. 3 an equivalent circuit of the sensor system with the presence of a body part in the field;

FIG. 4a a circuit arrangement with an LCR circuit to actuate the transmitter electrode;

FIG. 4b a circuit arrangement with a transformer to actuate the transmitter electrode;

FIG. 5 an application example for securing a vehicle hatchback door against crushing human limbs;

FIG. 6 a diagram to illustrate a detection circuit device in which both the characteristics on the transmitter side and the characteristics on the receiver side detectable via the respective circuit sections are taken into consideration in the generation of evaluation results which as such provide information about the existence of an approach state.

The arrangement represented in FIG. 1 shows a simplified assembly to explain the basic mode of operation of the circuit arrangement in accordance with the invention. The cross-sectional arrangement shown here can also be changed depending on the respective application case. The ridge, for example, could be round in shape. In general, however, the principle applies that to achieve the desired effect, the smaller the ridge height h, the larger the electrode distance d has to be.

The arrangement in accordance with the invention comprises of two electrodes $E_T$ and $E_R$, of which one is actuated by a transmitter and the other electrode $E_R$ is connected to a receiver. In conjunction with the electrode $E_T$ the transmitter generates an alternating electric field with a frequency which leads to a near field distribution in the close proximity this electrode. Both electrodes are screened off from each other by a conductive body of metal or conductive rubber in such a way that only a part of the field generated by the transmitter reaches the receiver electrode where it is output by the connected receiver as a signal. The proportion of the field generated by the transmitter electrode at the receiver electrode depends decisively on the geometry of the electrodes, in particular on the distance d from each other and on the height of a ridge h of the conductive material between the electrodes. The selection of these geometric parameters and the exact shape of the conductive substrate material depends on the specific application.

The sensor function of this arrangement for the detection of a boy part arises from the fact that a body part entering the field absorbs part of the field at the receiver electrode due to the fact that the human body is conductive and has a capacity $C_g$ against earth which causes the field line density to be reduced at the receiver electrode, thus reducing the signal amplitude output at the receiver. The lower the field line density at the receiver electrode in the basic condition, the more sensitive the arrangement for the detection of a body part. However, then the signal amplitude in the basic condition of the arrangement is also smaller. In the practical application, such a system is thus set at an operation point specific to the concrete application case between the signal amplitude necessary for reliable operation and sufficient sensitivity.

A decisive difference between the arrangement in accordance with the invention and conventional capacitive sensors consists in the fact that the functions of the transmitter and receiver electrode are separated and the field induction between the two electrodes is designed in such a way that the sensor effect described above is achieved. By separating the receiver electrode it is also possible to largely eliminate the damaging influences of moisture and metal parts in the proximity of the electrodes by designing the input impedance of the receiver electronics connected to the receiver electrode as described below.

The mode of operation of the sensor arrangement is described in more detail in the following in conjunction with the equivalent diagrams shown in FIG. 2 and FIG. 3. The field induction between transmitter and receiver electrodes is represented by an induction capacity $C_{k0}$ which is decisive for the signal amplitude at the output of a transimpedance amplifier. A special feature of such an amplifier with the open-circuit amplification $-V$ is that a virtual impedance of approximately $Z_e = R/V$ appears at the input, which means that the input impedance is very low when V is sufficiently large. Typical values at $R=500$ kOhm and $V=1000$ are then around $Z_e=500$ Ohm. All capacitive changes at the electrode input due to moisture or metal parts are then practically negligible as the input impedance is not significantly altered by a capacity lying parallel with R/V. (In contrast to this, conventional capacitive proximity sensors at high-ohm amplifier inputs work with the above-mentioned disadvantages in terms of environmental influences.) A further stage for amplitude measurement is also connected to the output of the transimpedance amplifier in order to gain direct voltage from the received alternating voltage which can then be further processed with the aid of an A/D converter in a microcontroller.

To gain this direct voltage which is proportional to the induction capacity, either a peak value detector with diodes or a synchronous demodulator can be used which is then operated with a frequency-equivalent carrier signal from the transmitter with a 90° phase displacement. The 90° phase displacement is necessary as, due to the capacitive induction, the output voltage of the transimpedance amplifier is also phase-displaced by 90° in relation to the voltage output by the transmitter.

When a body part enters the field, the induction capacity is reduced to a value $C_k < C_{k0}$ due to the absorption effect explained above, and the signal voltage output at the output of the transimpedance amplifier falls proportionally to $C_k$. Due to the ground capacity $C_g$ of the body and due to the low input impedance of the amplifier, all other effective capacities $C_1$ and $C_2$ between the electrodes (see FIG. 3) have only a negligible impact on the signal amplitude. The decisive effect is the reduction of the induction capacity as a result of the lower field line density at the receiver electrode. Water influences at both electrodes may lead to an increase in the capacities $C_1$ and $C_2$ but are negligible as explained above. Only a direct water connection between the electrodes would lead to an increase of the induction capacity. This can be avoided, however, by selecting suitable distances d, ridge height h and suitable insulation of the electrodes. The most expedient configuration of the sensor depends largely on the actual installation situation in the individual application case.

FIG. 4 shows two versions for the control of the transmitter electrode from a microcontroller. The first version in FIG. 4a uses a serial resonance circuit for which the electrode capacity $C_T$ represents part of the total capacity. Along with an additional capacity and the inductivity, the circuit is then tuned to the carrier frequency of the transmitter which typically lies within a range of 100 to 200 kHz. The voltages thus generated at the transmitter electrode are then around 20 to 30 V. FIG. 4b shows a control system with a transformer which transforms the carrier voltage supplied by the microcontroller to a higher electrode voltage. Due to the electrode capacity $C_T$, a parallel resonance circuit arises on the secondary side of the transformer whose resonance frequency can be tuned to the carrier frequency used by the appropriate selection of the secondary-side inductivity. The advantage of this version over the arrangement as shown in FIG. 4a is that in the case of changes in the electrode capacity, for example due to varying distances of the transmitter electrode to earth surfaces, the electrode voltage changes less than in the case of the arrangement in accordance with FIG. 4a. To achieve this, however, a higher costs outlay is necessary due to the transformer. Which version is used depends on the specific application.

FIG. 5 illustrates a concrete application case of the invention in the realization of a sensor system for a hatchback door security system on a vehicle. The two electrodes are laid along the edges of the hatch to be secured and divided into two separate left-hand and right-hand systems. This measure has the advantage that the influence that the movement of the door has at the end of the closing operation on the induction capacity between the transmitter and receiver electrode can be eliminated by using the signal supplied respectively by the electrode on the opposite side as a reference for the other signal. Due to this signal correlation, no further information regarding the hatchback position is necessary.

The above-described measure also means that the same or similar interferences on the left and right are largely compensated. A special feature of the system is that several transmitter electrodes are used on each side so that the inductions in the corresponding joint receiver electrode are reduced and thus the individual induction capacities are smaller than induction via a transmitter electrode laid continuously along all edges. This increases the sensitivity of the system to body parts entering the field and also advantageously reduces the signal dynamics in the receivers, thereby avoiding overdrive. The transmitter electrodes are preferably activated successively via a multiplexer with the send signal which means that detection events can also be allocated to observation sections and given priorities.

FIG. 6 shows a detection arrangement which, in accordance with a further solution approach in accordance with the invention, and independently of the measures described above, allows reliable detection of objects, in particular living beings in an observation zone. In accordance with the invention this detection arrangement comprises a transmitter electrode device for induction of an alternating electric field in the observation zone or its surrounding area, and a receiver electrode device to detect an electrical field in the observation zone or its surrounding area, whereby the generation of a signal regarding an approach status is based on the combined observation of two signals, whereby a first signal used here is a signal which correlates with the load on the transmitter system section, and the second signal is a signal which represents the strength of the field at the transmitter electrode device.

By using this technique to observe the movement path of a hatchback door of a car, the transmitter electrode device can be realized directly by the body of the hatchback door.

This hatchback door is preferably connected to the vehicle body by an insulating structure. The electric consumers mounted in the area of the hatchback door are also connected to the vehicle electric system by their own earth connections. The transmitter electrode device can also take the form of a different structure, e.g. a U-shaped strip or wire electrode laid along the bottom and side edges of the hatchback door. The transmitter electrode device can also be integrated by other means in the hatchback door. In particular, it is also possible to realize the transmitter electrode device in the rear window, in particular in the integrated rear window heating system.

The receiver electrode device is preferably located in the area of the closing or sealing edges of the vehicle body.

The first signal can be, in particular, the current to the transmitter electrode device, in particular also the power intake of the transmitter electrode device, the phase angle between current and voltage, or the characteristics of the time-related course of current and/or voltage within the range of the transmitter system.

The second signal is preferably a signal which correlates directly with the strength of the field advancing toward the receiver electrode device.

The detection arrangement can also be realized in reverse, i.e. components on the hatchback door side function as receiver electrodes and electrode structures on the body function as transmitters.

It is possible to establish certain reference information for the opening and closing operation of a hatchback door, in particular the course of reference signal, and to check whether any deviations from these reference processes occur during opening or closing.

The invention claimed is:

1. A detection arrangement for detection of an approach or a presence of objects, in particular moving limbs, toward or in an observation zone, comprising: a circuit, a transmitter electrode coupled with a microcontroller, a receiver electrode and an isolation electrode, wherein the circuit is a resonance circuit that controls the transmitter electrode from the microcontroller, and the circuit is tuned to a carrier frequency of the transmitter electrode, wherein the transmitter electrode for an induction of an alternating electric field in the observation zone or its surrounding area, wherein the receiver electrode to detect the alternating electric field in the observation zone or its surrounding area, and wherein the isolation electrode to screen a part of the alternating electric field extending between the transmitter electrode and the receiver electrode, wherein the isolation electrode comprises a base plate that extends under the transmitter electrode and the receiver electrode and the isolation electrode comprises a ridge section which extends vertically from the base plate within a space between the transmitter electrode and the receiver electrode, wherein a height of the ridge section depends on a distance between the transmitter electrode and the receiver electrode such that the larger the distance between the transmitter electrode and the receiver electrode the smaller the height of the ridge section.

2. The detection arrangement in accordance with claim 1 wherein the isolation electrode is made of a metallic material.

3. The detection arrangement in accordance with claim 1 wherein the isolation electrode is made of a conductive synthetic material.

4. The detection arrangement in accordance with claim 1 wherein the transmitter electrode and the receiver electrode are executed as wire-like electrode structures.

5. The detection arrangement in accordance with claim 1 wherein the transmitter electrode and the receiver electrode are arranged as electrodes which are essentially equidistant in relation to each other.

6. The detection arrangement in accordance with claim 1 wherein the ridge section is designed to extend beyond a vertical extension of the transmitter electrode and the receiver electrode with respect to the base plate.

7. The detection arrangement in accordance with claim 1 wherein the isolation electrode further comprising a T-profile cross section.

8. The detection arrangement in accordance with claim 1 wherein the transmitter electrode and the receiver electrode are integrated in a sealing unit.

9. The detection arrangement in accordance with claim 1 wherein the isolation electrode forms a center point electrode.

10. The detection arrangement in accordance with claim 1 wherein the detection of the alternating electric field at the receiver electrode takes place via a transimpedance circuit.

11. The detection arrangement in accordance with claim 10 wherein the transimpedance circuit is configured in such a way that an input impedance at the receiver electrode is extremely small.

12. The detection arrangement in accordance with claim 1 wherein a voltage is applied to the transmitter electrode by a transmitter circuit and wherein in conjunction with the transmitter electrode the voltage generates the alternating electric field with a certain frequency which leads to a near field distribution in a direct surroundings of the transmitter electrode.

13. The detection arrangement in accordance with claim 1 wherein both the transmitter electrode and the receiver electrode are screened off from each other by a conductive body of metal or conductive rubber in such a way that only part of the alternating electric field generated by the transmitter electrode reaches the receiver electrode where it is output as a signal by the receiver electrode.

14. The detection arrangement in accordance with claim 1 wherein functions of the transmitter electrode and receiver electrode are separated and wherein an event is detected based on characteristics of a field induction between the transmitter electrode and the receiver electrode.

15. The detection arrangement in accordance with claim 1 wherein the transmitter electrode and the receiver electrode are executed as strips or other long, flat structures.

16. The detection arrangement in accordance with claim 1 wherein the transmitter electrode and the receiver electrode are made of a conductive synthetic material, in particular an elastomer material.

17. The detection arrangement in accordance with claim 1 wherein the transmitter electrode and the receiver electrode are divided into several electrode sections and wherein these electrode sections are activated separately.

18. The detection arrangement in accordance with claim 17 wherein the transmitter electrode and the receiver electrode, in particular the receiver electrode, are activated by a multiplexer.

19. The detection arrangement in accordance with claim 17 wherein an area allocation of detected proximity processes takes place via signals detected by the electrode sections.

20. The detection arrangement in accordance with claim 1, wherein the resonance circuit is a serial resonance circuit comprising an inductance, resistance and a capacitance.

21. The detection arrangement in accordance with claim 1, wherein the resonance circuit is a parallel resonance circuit comprising a secondary winding of a transformer coupled in parallel with said transmitter electrode, wherein a primary winding of the transformer is coupled with the microcontroller.

* * * * *